(12) United States Patent
Luzzi et al.

(10) Patent No.: US 8,138,764 B2
(45) Date of Patent: Mar. 20, 2012

(54) TEST CIRCUIT FOR MONITORING A BANDGAP CIRCUIT

(75) Inventors: Raimondo Luzzi, Graz (AT); Marco Bucci, Graz (AT)

(73) Assignee: Infineon Technologies AG, Neubiberg (DE)

( * ) Notice: Subject to any disclaimer, the term of this patent is extended or adjusted under 35 U.S.C. 154(b) by 440 days.

(21) Appl. No.: 12/497,220

(22) Filed: Jul. 2, 2009

(65) Prior Publication Data

US 2011/0001555 A1 Jan. 6, 2011

(51) Int. Cl.
*G01R 31/08* (2006.01)
*G05F 3/16* (2006.01)
*G01P 21/00* (2006.01)

(52) U.S. Cl. .......... 324/522; 323/313; 702/108
(58) Field of Classification Search .......... 324/522, 324/512, 500, 523, 527; 323/313; 702/64, 702/57, 1, 108, 117, 127, 182, 183, 189
See application file for complete search history.

(56) References Cited

U.S. PATENT DOCUMENTS

| | | | | |
|---|---|---|---|---|
| 7,272,523 | B1 * | 9/2007 | John et al. | 702/85 |
| 7,521,960 | B2 * | 4/2009 | Balasubramanian et al. | 326/38 |
| 7,613,943 | B2 * | 11/2009 | Bakker et al. | 713/330 |
| 2010/0148744 | A1 * | 6/2010 | Kresse et al. | 323/313 |

* cited by examiner

*Primary Examiner* — Hoai-An D Nguyen
(74) *Attorney, Agent, or Firm* — Dickstein Shapiro LLP

(57) ABSTRACT

A test circuit provided to monitor a bandgap circuit that outputs a bandgap reference voltage The test circuit includes a reference voltage test module to output a first pass signal when an operating voltage of the bandgap circuit is greater than a first threshold voltage; an output test module to output a second pass signal when an output voltage of the bandgap circuit is greater than a second threshold voltage; and an overdrive test module to output a third pass signal when a minimum operating voltage of the test circuit is detected. Furthermore, a logic circuit is provided and coupled to outputs of each of the test modules. The logic circuit is further configured to output an operating signal, which indicates that the bandgap reference voltage is stable, after receiving the first, second, and third pass signals.

24 Claims, 7 Drawing Sheets

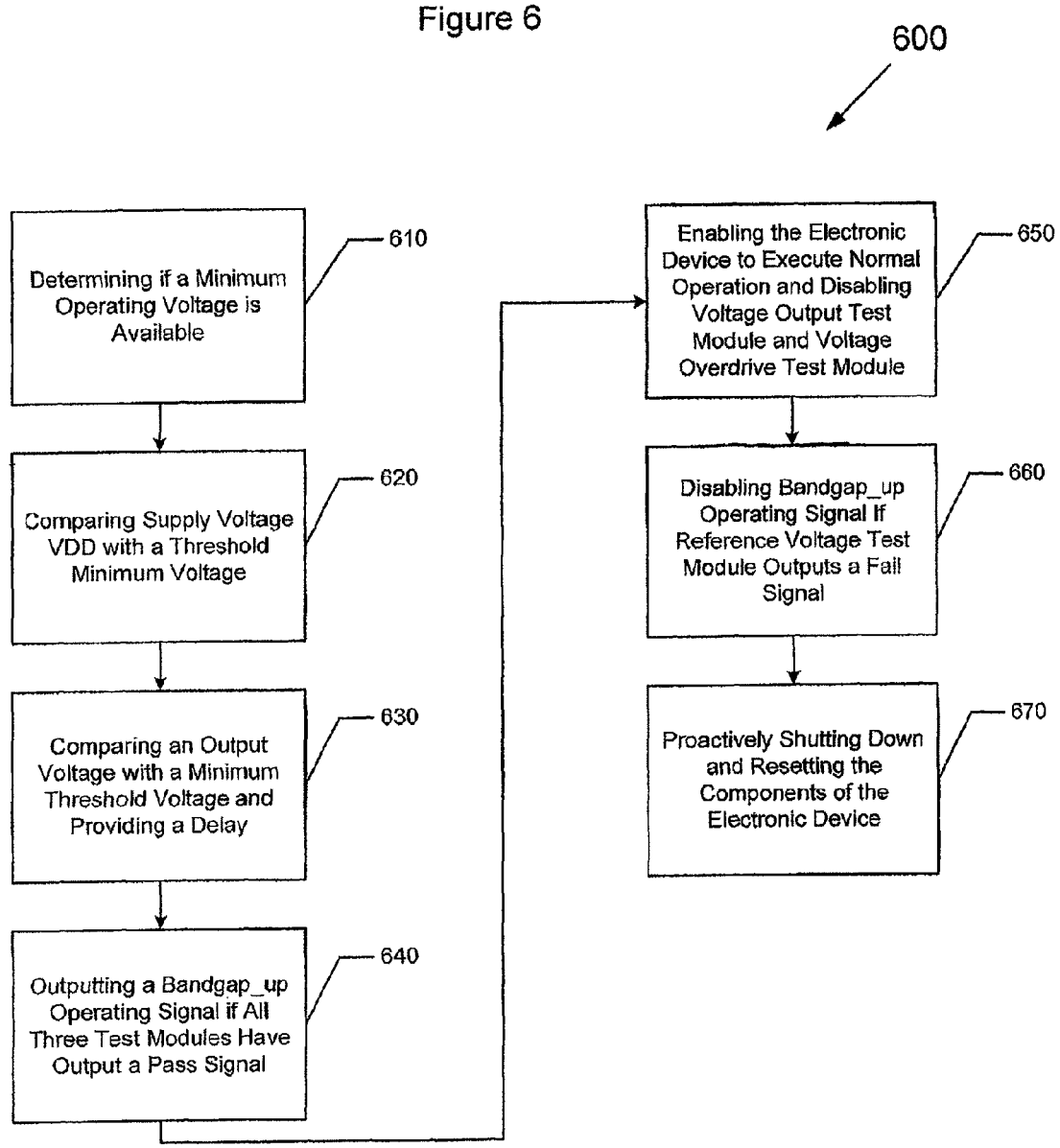

TEST CIRCUIT FOR MONITORING A BANDGAP CIRCUIT

BACKGROUND

A bandgap voltage reference is a voltage reference that is widely used in integrated circuits. The bandgap voltage reference circuit generally uses junction-isolated bipolar-IC technology to make the stable low-voltage reference. The bandgap voltage reference has become popular as a stable voltage reference for low-voltage circuits. For example, bandgaps have been used in digital integrated circuits to provide a local bias that is not adversely affected by ambient noises or transients.

Contactless card applications, which involve communication between a reader and a contactless card via a carrier signal, have also used the bandgap as a reference voltage. Specifically, in these applications, powering on and off the contactless card's circuit can be critical since the power supply may perform sequences of false starts, i.e., sudden drops and quick restarts. In the absence of an appropriate startup or restart procedure, these circuits can be driven into incorrect operation.

In particular, analog functions of a contactless card can rely on a bandgap voltage reference, and in some situations, these analog functions must be disabled if the bandgap circuit is not operating correctly. Furthermore, merely delaying the circuit's operation does not guarantee correct operation because, for example, during a fast power off/on sequence, the circuit will restart with the delay being disabled since the circuit did not fully discharge. As a result, the circuit of the contactless card may begin operating incorrectly.

BRIEF DESCRIPTION OF THE DRAWINGS

FIG. 6 illustrates a flowchart for a method for monitoring a bandgap circuit.

DETAILED DESCRIPTION

The present application is directed to a test circuit for a bandgap reference voltage circuit. More specifically, the application is directed to a test circuit comprising test modules coupled to a logic circuit, in which the logic circuit outputs an operating signal indicating the bandgap reference voltage is stable once all of the test modules output pass signals, respectively.

Figure 1:
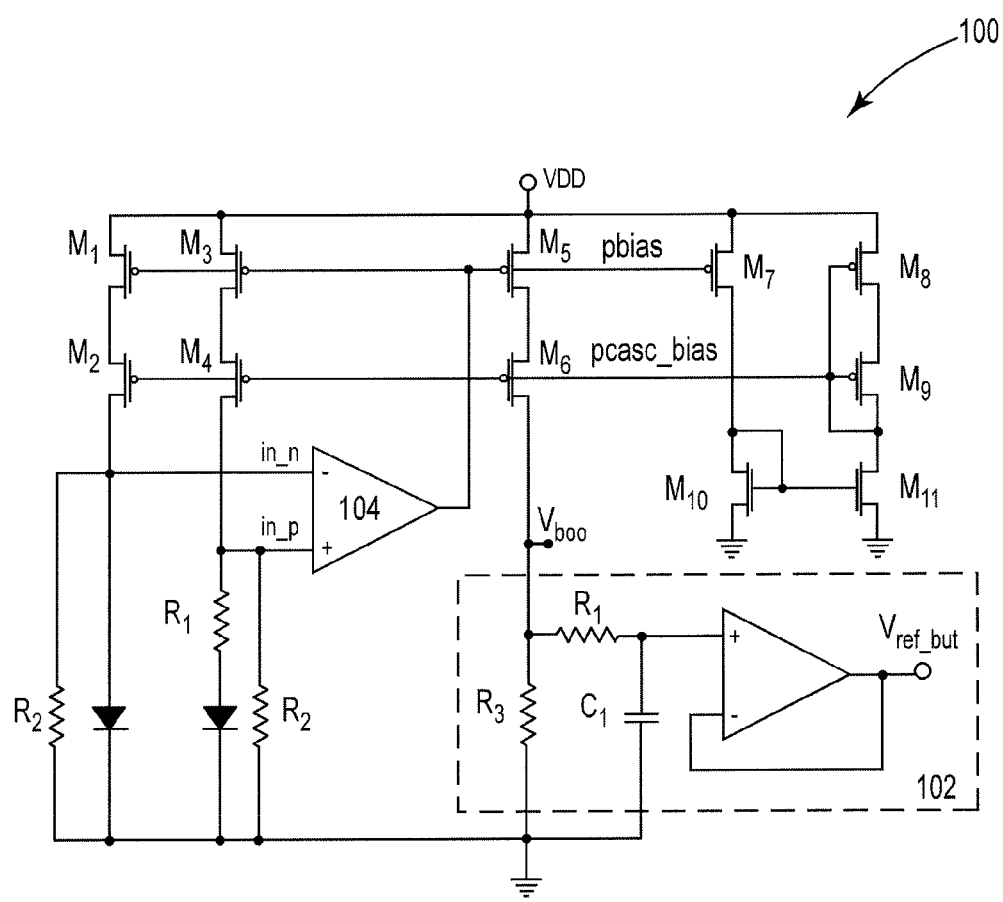
FIG. 1 illustrates a circuit diagram of a typical bandgap circuit.

FIG. 1 shows a circuit diagram of a typical bandgap circuit 100. Bandgap circuit 100 includes an output stage 102 including a low pass filter and a buffer with an output voltage Vref_buf. In operation, bandgap circuit 100 provides a bandgap voltage reference Vbgp which can serve as a stable low-voltage reference for an electronic device. In addition, bandgap circuit 100 may include common electronic components such as transistors M1-M11 and differential amplifier 104. While these components are shown to further illustrate the implementation of a typical bandgap circuit, their operation should be known to those skilled in the art and will not be discussed in more detailed in order to not unnecessarily obscure aspects of the application.

Furthermore, as will be described below with respect to certain exemplary embodiments, one electronic device that typically utilizes a bandgap reference voltage is a contactless card, also known as a chip card, smart card, RFID tag, or proximity IC card (PICC). The test circuit disclosed in this application is in no way intended to be limited for use in contactless cards, rather, the inventive test circuit is capable of being used with any electronic device that employs a bandgap reference voltage.

Referring back to FIG. 1, as should be clear, bandgap voltage reference Vbgp is at least indirectly dependent on a supply voltage VDD. Moreover, if bandgap circuit 100 is employed in a contactless card, supply voltage VDD may be derived from the voltage received by the antenna of the contactless card. Generally, in contactless card applications, a reader transmits a carrier signal which creates an electromagnetic field. The contactless card will include circuitry to detect the electromagnetic field and rectifiers to convert this voltage to provide a DC power supply. This rectified voltage will typically be regulated by a reference voltage, generally the bandgap reference, to serve as a DC power supply for the contactless card components. Accordingly, with respect to bandgap circuit 100, if the electronic device is a contactless card, the rectified, regulated voltage may serve as the supply voltage VDD.

It should further be understood by those skilled in the art of contactless card applications that the strength of the voltage received by the antenna corresponds to the distance between the contactless card and the reader and is based on the strength of the electromagnetic field. Accordingly, when the contactless card is more than a given distance from the reader, the antenna will not detect the electromagnetic field generated by the carrier signal, and, therefore, supply voltage VDD will equal zero volts. Effectively, bandgap reference voltage Vbgp will also equal zero volts. Therefore, in these instances, determining the correct operation of bandgap circuit 100 encounters a bootstrapping problem. Meaning that although supply voltage VDD is provided to bandgap circuit 100 to generate bandgap reference voltage Vbgp, at the same time, supply voltage VDD is also regulated by bandgap reference voltage Vbgp. However, because bandgap reference voltage Vbgp is initially zero volts, supply voltage VDD is not initially regulated by bandgap reference voltage Vbgp once the antenna begins to receive a voltage.

It is reiterated that this example does not limit the application to contactless cards. Rather, the inventive test circuit is capable of monitoring a bandgap circuit for any device utilizing a bandgap voltage reference as a stable low-voltage reference. The above exemplary problem that occurs in contactless card applications is merely provided to illustrate some of the advantages of the inventive test circuit.

Figure 2:
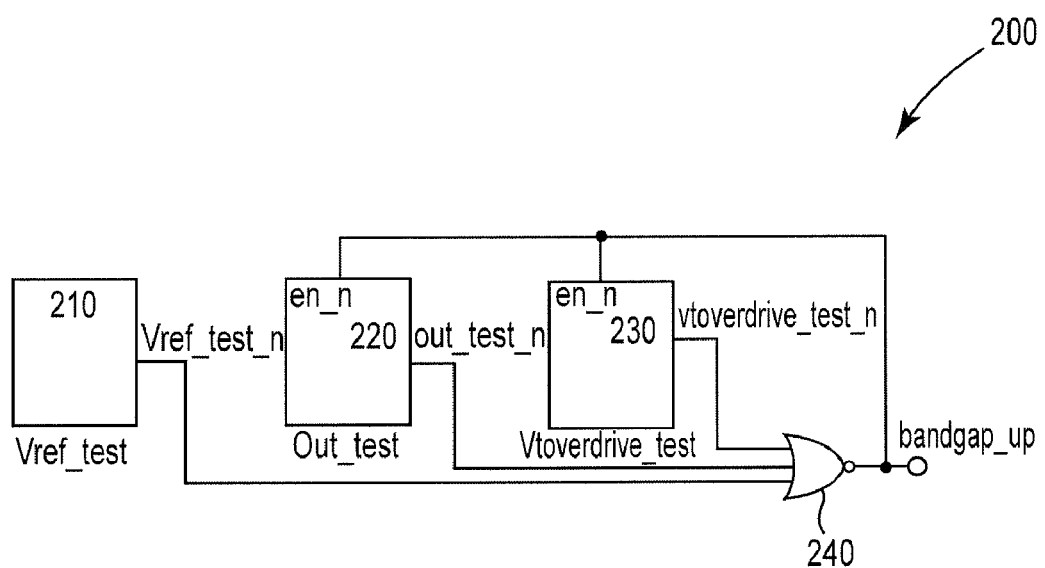
FIG. 2 illustrates a block diagram of the test circuit in accordance with an exemplary embodiment.

FIG. 2 shows a block diagram of the test circuit in accordance with an exemplary embodiment. More particularly, test circuit 200 comprises multiple test modules provided to monitor a bandgap circuit, such as bandgap circuit 100, for example. As shown, test circuit 200 comprises reference voltage test module 210, voltage output test module 220; voltage overdrive test module 230; and logic circuit 240. The inputs of logic circuit 240 are coupled to the outputs of each of the test modules.

Reference voltage test module 210 is provided to ensure bandgap circuit 100 has a sufficient supply voltage to correctly output a stable bandgap reference voltage Vbgp. As will be discussed in more detailed below, reference voltage test module 210 compares supply voltage VDD with a threshold minimum voltage and outputs a signal accordingly. If supply voltage VDD is greater than the threshold minimum voltage, reference voltage test module 210 will output a pass signal represented by a logical "0". Alternatively, if the threshold minimum voltage is not satisfied, the output of reference voltage test module 210 will be a fail signal represented by a logical "1".

Voltage output test module 220 provides two functions. First, during start up or restart, voltage output test module 220 provides a delay that is independent of the other two test modules. Second, voltage output test module 220 ensures that bandgap reference voltage Vbgp is sufficiently stable by comparing the output voltage Vref_buf of the buffer with another minimum threshold voltage. If output voltage Vref_buf is greater than this second threshold minimum voltage, reference voltage test module 210 will output a pass signal represented by a logical "0". Alternatively, if output voltage Vref_buf is less than this second threshold minimum voltage, the output of reference voltage test module 210 will be a fail signal represented by a logical "1". As will be discussed below, the exemplary embodiment employs a minimum threshold voltage at approximately 95% of the bandgap reference's normal operating voltage. Of course, this minimum threshold voltage can be any suitable voltage as defined by the test circuit designer in accordance with the intended purpose of test circuit 200.

Finally, voltage overdrive test module 230 is provided to detect that a minimum operating voltage is available for test circuit 200. When a minimum operating voltage is detected, voltage overdrive test module 230 will output a pass signal represented by a logical "0", otherwise, voltage overdrive test module 230 will output a fail signal represented by a logical "1".

As shown in FIG. 2, the respective outputs of each test module are coupled to the inputs of logic circuit 240. In one embodiment, logic circuit 240 is a logical NOR gate. Accordingly, the output of logic circuit 240 will only assume a high state, i.e., a logical "1", when all three inputs are in low states (logical "0s"). Otherwise, logic circuit 240 will assume a low state if any of its inputs are logical "1s". In other embodiments, logic circuit 240 can be other logical gates. For example, in one embodiment logic circuit 240 is a logical AND gate and therefore only outputs a logical "1" when the outputs of all test modules assume high states. This could be achieved, for example, by employing inverters at each of the outputs of the respective test modules described above.

The output signal of logic circuit 240 will be referred to as a "bandgap_up" operating signal and serves as an operating signal provided to indicate when bandgap reference voltage Vbgp is stable. The bandgap_up operating signal may be input to other components of the electronic device, such as a microprocessor. After startup, once the bandgap_up operating signal assumes a high state, the electronic device will interpret this signal to mean that bandgap reference voltage Vbgp is stable. As a result, the electronic device can then perform its designated operation according to its given application, such as an electronic data transfer, for example. It should be clear that each testing module is monitoring and/or ensuring that various operating requirements have been satisfied. Thus, when any of the three testing modules output a fail signal represented by a logical "1", the output of NOR logic circuit 240 (i.e., the bandgap_up operating signal) will be in a low state, indicating to the electronic device that bandgap reference voltage Vbgp is not stable. As a result, the low bandgap_up operating signal will prohibit the electronic device from performing its normal operation.

In addition, the output of logic circuit 240 is further coupled back to voltage output test module 220 and voltage overdrive test module 230. Once the bandgap_up operating signal assumes a high state, output test module 220 and voltage overdrive test module 230 are disabled in response thereto with their respective outputs remaining in the low state. This design enables the electronic device to minimize the power consumed during its normal operation. Also, as a result of this design, only reference voltage test module 210 is active during the electronic device's normal operation. Accordingly, when supply voltage VDD drops below the threshold minimum voltage, as discussed above, reference voltage test module 210 will output a fail signal, disabling the bandgap_up operating signal such that it assumes a low state, represented by a logical "0". In turn, the electronic device will proactively execute various shut down and reset operations in response to the low bandgap_up operating signal, ensuring that all of its components, including test circuit 200, will operate correctly upon restart.

Figure 3A:
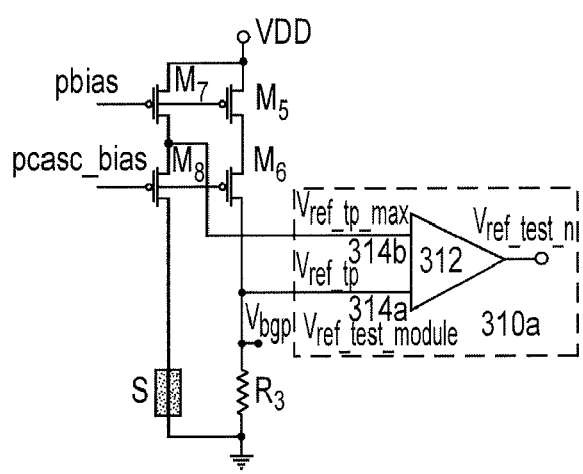
FIG. 3a illustrates one embodiment of the reference voltage test module.

FIG. 3a illustrates one embodiment of reference voltage test module 210. As noted above, this test module indirectly monitors the correct operation of bandgap circuit 100 shown in FIG. 1, by monitoring whether voltage supply VDD is greater than threshold minimum voltage. A minimum supply voltage VDD is required for bandgap circuit 100 to saturate the diode branches D1 and D2, to saturate the output branch (i.e., resistor R3), and to correctly power the bandgap differential amplifier. Reference voltage test module 210 therefore compares supply voltage VDD with a requisite minimum operating voltage and outputs a pass or fail signal based on this comparison.

As shown, reference voltage test module 310A comprises a high speed comparator 312 whose inputs are coupled to specific test points of bandgap circuit 100. First, a voltage reference test point Vref_tp is coupled to non-inverting input 314a. The voltage at reference test point Vref_tp serves as a threshold minimum voltage for supply voltage VDD. Second, a maximum voltage reference test point Vref_tp_max is coupled to inverting input 314b. When the voltage at Vref_tp is greater than the voltage at Vref_tp_max, the output vref_test_n of high speed comparator 312 assumes a high state, providing a fail signal. In the alternative, when the voltage at Vref_tp_max is greater than the voltage at Vref_tp, the output vref_test_n high speed comparator 312 assumes a low state, indicating bandgap circuit 100 has sufficient supply voltage VDD and providing a pass signal accordingly. It should be clear that the output vref_test_n of high speed comparator 312 corresponds to the output vref_test_n of reference voltage test module 210 illustrated in the block diagram FIG. 2.

To further illustrate the interaction between reference voltage test module 310 and bandgap circuit 100, the circuit diagram shown in FIG. 3a includes certain electronic components of bandgap circuit 100. For example, an output branch consisting of transistors M5 and M6 of FIG. 3a correspond to transistors M5 and M6 of FIG. 1. As illustrated in both figures, the drain of transistor M6 is coupled to the output branch of bandgap circuit 100, and more specifically, to resistor R3. It is at this junction where bandgap reference voltage Vbgp can be measured. As further shown in FIG. 3a, voltage reference test point Vref_tp is positioned in bandgap circuit 100 adjacent to bandgap reference voltage Vbgp. Therefore, in this embodiment, high speed comparator 312 is effectively comparing bandgap reference voltage Vbgp, i.e., voltage reference test point Vref_tp, with the maximum voltage reference test point Vref_tp_max.

Moreover, a reference branch comprising transistors M7 and M8 is provided to generate a voltage to be measured as maximum voltage reference test point Vref_tp_max. As shown, currents pbias and pcasc_bias are provide to the gates of transistors M7 and M8, respectively. In this embodiment, the voltage at Vref_tp_max will be the voltage at a point between the drain of transistor M7 and the source of transistor M8. Effectively, Vref_tp_max is measuring the supply voltage VDD minus some voltage $\Delta V$, which is the voltage drop through transistor M7 and, in this embodiment, should be approximately one overdrive by design. Dissimilar to output transistor branch (M5 and M6), the reference branch (M7 and M8) is not necessarily a dedicated branch of transistors of bandgap circuit 100. Rather, it is sufficient that the applied reference branch is connected to ground and that its load S has a voltage drop that is less than the voltage drop across resistor R3. As a result, while the reference branch may not be shown in FIG. 1 in order to avoid unnecessarily obscuring the aspects of bandgap circuit 100, such an additional reference branch is generally employed to generate further current referencing and/or current mirroring.

Figure 3B:
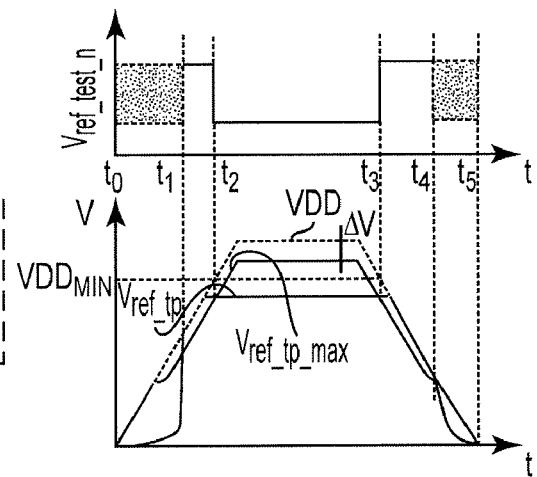
FIG. 3b illustrates an exemplary voltage diagram of the reference voltage test module.

To help further explain the operation of reference voltage test module 310A, FIG. 3b illustrates a voltage diagram representing a power on/off sequence of an electronic device employing test circuit 200. Specifically, supply voltage VDD is shown in this example as a trapezoidal ramp, which, as discussed above, is indirectly related to the voltage received by the antenna of a contactless card. As the contactless card moves closer to the reader, the strength of the received voltage increases, and, therefore, supply voltage VDD will also increase. Alternatively, if the contactless card moves away from the reader, supply voltage VDD will decrease. The example of supply voltage VDD increasing and decreasing accordingly is represented by the dashed trapezoidal ramp in FIG. 3b.

Furthermore, since the voltages at test points Vref_tp and Vref_tp_max are depend on supply voltage VDD, these voltages will also increase when supply voltage VDD increases and vice versa. Because reference voltage test module 310A is provided to detect that supply voltage VDD has reached a sufficient operating voltage by comparing Vref_tp_max and Vref_tp, these voltages are also shown in FIG. 3b. Moreover, once supply voltage VDD reaches a given voltage, both the output transistor branch (M5 & M6) and the reference transistor branch (M7 & M8) will become saturated. Meaning, there will be a voltage drop across transistor M6 and the voltage at Vref_tp_max will have approximately the same voltage potential as the drain of transistor M5. As a result, the voltage at Vref_tp_max is greater than the voltage at Vref_tp (see time t2). As discussed above, once this occurs, the output vref_test_n of high speed comparator 312 will switch from a high state to a low state providing a pass signal.

Alternatively, when supply voltage VDD falls below a certain voltage, the output transistor branch (M5 & M6) will no longer be saturated, meaning resistor R3 will be unable to sink sufficient current and, as a result, the voltage at Vref_tp will be equal to supply voltage VDD by transistor M5. At the same time, reference transistor branch (M7 & M8) will remain saturated because its load has a voltage drop that is less than that of resistor R3. Accordingly, there will still be a correct voltage drop across transistor M7 and the voltage at Vref_tp will effectively be greater than voltage Vref_tp_max. This result is illustrated both at time period t1-t2 and t3-t4 of FIG. 3b. Because voltage Vref_tp is less than voltage Vref_tp_max, the output vref_test_n of high speed comparator 312 will assume a high state during these time periods. It is reiterated that a high state (a fail signal) from high speed comparator 312 corresponds to the output of reference voltage test module 310A providing a signal indicating that supply voltage VDD is below a threshold minimum voltage.

Finally, when supply voltage VDD is slighter greater than zero volts, neither transistor branch is saturated. As shown in FIG. 3b at time periods time periods t0-t1 and t4-t5, the voltage at Vref_tp_max will be greater than the voltage at Vref_tp even though supply voltage VDD is not in fact at a stable operating voltage. It should be clear that because voltage Vref_tp_max is greater than voltage Vref_tp, the output vref_test_n of high speed comparator 312 will assume a low state. However, because supply voltage VDD is not at a sufficient operating voltage for bandgap circuit 100, the low state of output vref_test_n is effectively providing a false positive, i.e., an incorrect pass signal. Meaning reference voltage test module 310 is indicating to test circuit 200 that supply voltage VDD is sufficient, when in fact, it is not sufficient. The false positives are illustrated in the grey areas of the graph in FIG. 3b showing output vref_test_n versus time.

In order to account for the false positive upon startup or restart (t0-t1), test circuit 200 further employs voltage output test module 220 and voltage overdrive test module 230. These test modules essentially restrict the bandgap_up operating signal from assuming a high state even though reference voltage test module 310A is outputting a false positive. For example, voltage overdrive test module 230 ensures that a minimum operating voltage $VDD_{min}$ is available for reference voltage test module 210 and voltage output test module 220. This minimum voltage $VDD_{min}$ is also illustrated in FIG. 3b. Once supply voltage VDD becomes greater than $VDD_{min}$ the output vtoverdrive_test_n of voltage overdrive test module 230 will assume a low state, providing a pass signal. However, until this minimum voltage $VDD_{min}$ is reached, the output vtoverdrive_test_n of voltage overdrive test module 230 will be in a high state, providing a fail signal. Therefore, even though reference voltage test module 310A is outputting a false positive, because supply voltage VDD has not surpassed the minimum voltage $VDD_{min}$, the output vtoverdrive_test_n of voltage overdrive test module 230 will be high, and, therefore, the bandgap_up operating signal will remain in a low state.

Figure 3C:
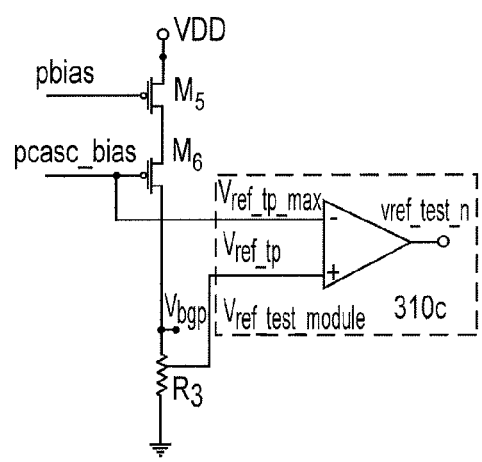
FIG. 3c illustrates another embodiment of the reference voltage test module.
Figure 3D:
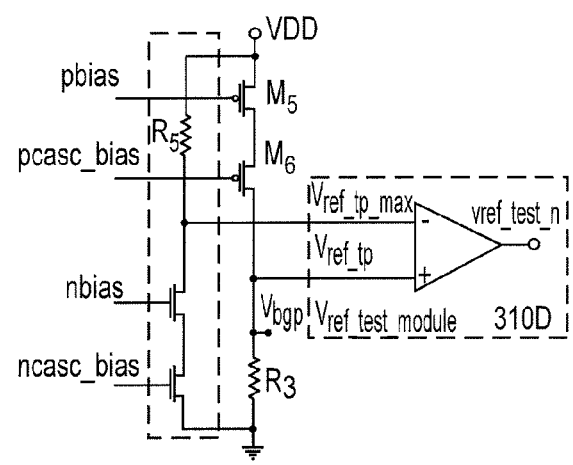
FIG. 3d illustrates another embodiment of the reference voltage test module.

As described above, FIG. 3a illustrates only one embodiment of reference voltage test module 210. FIGS. 3c and 3d show two alternative embodiments of reference voltage test module 210. These embodiments perform substantially the same purpose as the embodiment shown in FIG. 3a. Namely, these alternative embodiments both utilize a high speed comparator to compare supply voltage VDD with a threshold minimum operating voltage and to output a signal accordingly. The main difference of these alternative embodiments is that they are designed to be used to monitor a bandgap circuit that is providing a lower bandgap reference voltage (e.g. approximately 0.4 volts).

As shown in FIG. 3c, Vref_tp_max of reference voltage test module 310C is connected to pcasc_bias. $\Delta V$ (VDD—Vref_tp_max) therefore consists of the biasing voltage of transistor M6. Alternatively, although not shown, transistor M5 could be employed for this purpose in yet another embodiment. In order to establish the proper test threshold voltage, Vref_tp is ascertained by a suitable tap on resistor R3. As a result of this design, $\Delta V$ may decrease with temperature. Therefore, if the ambient temperature increases, a lower minimum supply voltage $V_{min}$ will be defined.

Alternatively, as shown in FIG. 3d, reference voltage test module 310D employs a dedicated NMOS current branch and resistor R5, which are provided to obtain the voltage at Vref_tp_max. Thus, the reference voltage test module in this embodiment operates similarly to the embodiment of FIG. 3c except that ΔV will not be dependent on temperature.

It is noted that similar to the embodiment in FIG. 3a, for both embodiments in FIGS. 3c and 3d, transistors M5 and M6 correspond to those same transistors illustrated in FIG. 1. Accordingly, the high speed comparator 312 of any the aforementioned reference voltage test modules is employed to compare a voltage at Vref_tp with a requisite voltage at Vref_tp_max that must be available.

Figure 4A:
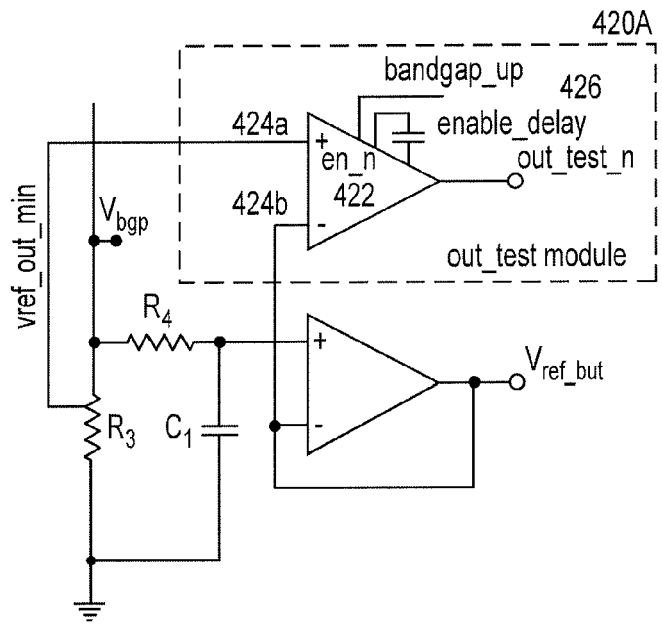
FIG. 4a illustrates one embodiment of the voltage output test module.

FIG. 4a illustrates one embodiment of the voltage output test module. As discussed above, voltage output test module 420A provides two functions. First, during start up or restart, voltage output test module 420A ensures that the reference voltage test module has sufficient time to initialize its monitoring process for supply voltage VDD. Second, voltage output test module 420A ensures that bandgap reference voltage Vbgp is sufficiently stable for the electronic device to use as a reference voltage.

As shown, voltage output test module 420A comprises a differential amplifier 422 with an enable delay 426 that resets each time voltage output test module 420A is disabled. It is reiterated that voltage output test module 420A becomes disabled when the bandgap_up operating signal assumes a high state. Specifically, voltage output test module 420A employs capacitor $C_{enable\_delay}$ such that the module's output out_test_n will remain in a high state (a fail signal) until capacitor $C_{enable\_delay}$ is fully charged. Once it is fully charged, output out_test_n will assume a low state providing a pass signal. Because output out_test_n, which is input to logic circuit 240, is delayed before assuming a low state, the bandgap_up operating signal will also consequently be delayed before assuming a high state. Of course, the bandgap_up operating signal can only assume a high state if the output of the other two test modules are also in a low state.

Voltage output test module 420A also compares the output voltage Vref_buf with a minimum threshold voltage, which effectively ensures that bandgap reference voltage Vbgp is sufficiently stable to serve as a reference voltage. Simply put, voltage output test module 420A compares the end of the output chain Vref_buf with its input. As shown, the operational amplifier 422, functioning as a high speed comparator, is provided to compare Vref_buf with a minimum threshold voltage vref_out_min. As noted above, in one embodiment, this minimum threshold voltage vref_out_min can equal 95% of Vref_out.

Specifically, vref_out_min is coupled to the non-inverting input 424a of high speed comparator 422 and Vref_buf is coupled to the inverting input 424b of high speed comparator 422. In startup or restart, when Vref_buf is less than vref_out_min, the output out_test_n of high speed comparator 422 will be in a high state. Subsequently, once bandgap reference voltage Vbgp becomes sufficiently stable, Vref_buf will be greater than vref_out_min, indicating that the entire output stage of bandgap circuit 100 is settled and that the output buffer has sufficient power supply. As a result, the output out_test_n of high speed comparator 422 will assume a low state providing a pass signal, subject to the delay created by capacitor $C_{enable\_delay}$.

Figure 4B:
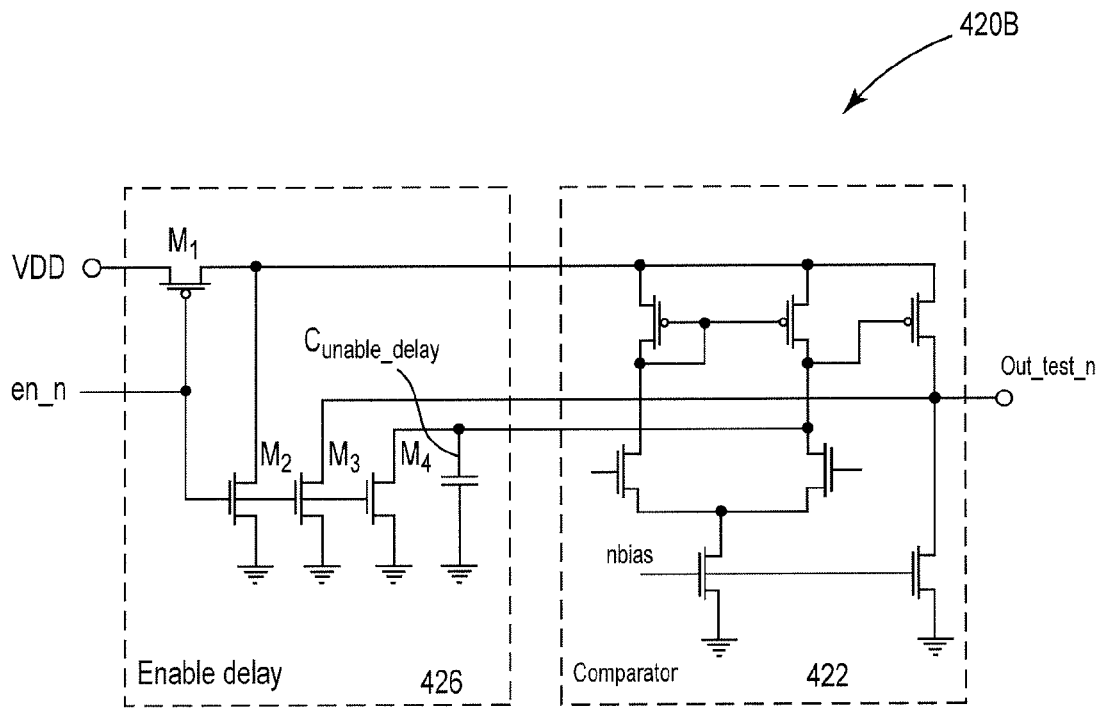
FIG. 4b illustrates an exemplary circuit diagram of the voltage output test module.

FIG. 4b illustrates a circuit diagram of voltage output test module 420B. As shown, supply voltage VDD is provided to power both high speed comparator 422 and enable delay 426.

High speed comparator 422 include electronic components commonly found in such devices, the operation of which is known and will not be discussed in more detailed. Moreover, input is provided to receive the bandgap_up operating signal as an enable signal en_n. This feature should be apparent when viewed in conjunction with FIG. 2. As noted above, once the bandgap_up operating signal assumes a high state and the electronic device is in normal operation, voltage output test module 420B becomes disabled. As a result, capacitor $C_{enable\_delay}$ will be discharged by transistor M4. Concurrently, transistors M1, M2, and M3 will force the output out_test_n to a low state. Subsequently, when voltage output test module 420B becomes enabled again, capacitor $C_{enable\_delay}$ will force output out_test_n to a high state until the capacitor is fully charged. Effectively, capacitor $C_{enable\_delay}$ provides a delay before bandgap circuit 100 begins normal operation. This mechanism is particularly important when bandgap circuit 100 experiences a fast power off/on sequence. In such instances, capacitor $C_{enable\_delay}$ ensures that reference voltage test module 210 has a sufficient startup time. Moreover, it prevents the bandgap_up operating signal from oscillating when bandgap circuit 100 is experiencing borderline operating conditions, i.e., when supply voltage VDD is only slightly above or below a sufficient minimum operating voltage.

Figure 5:
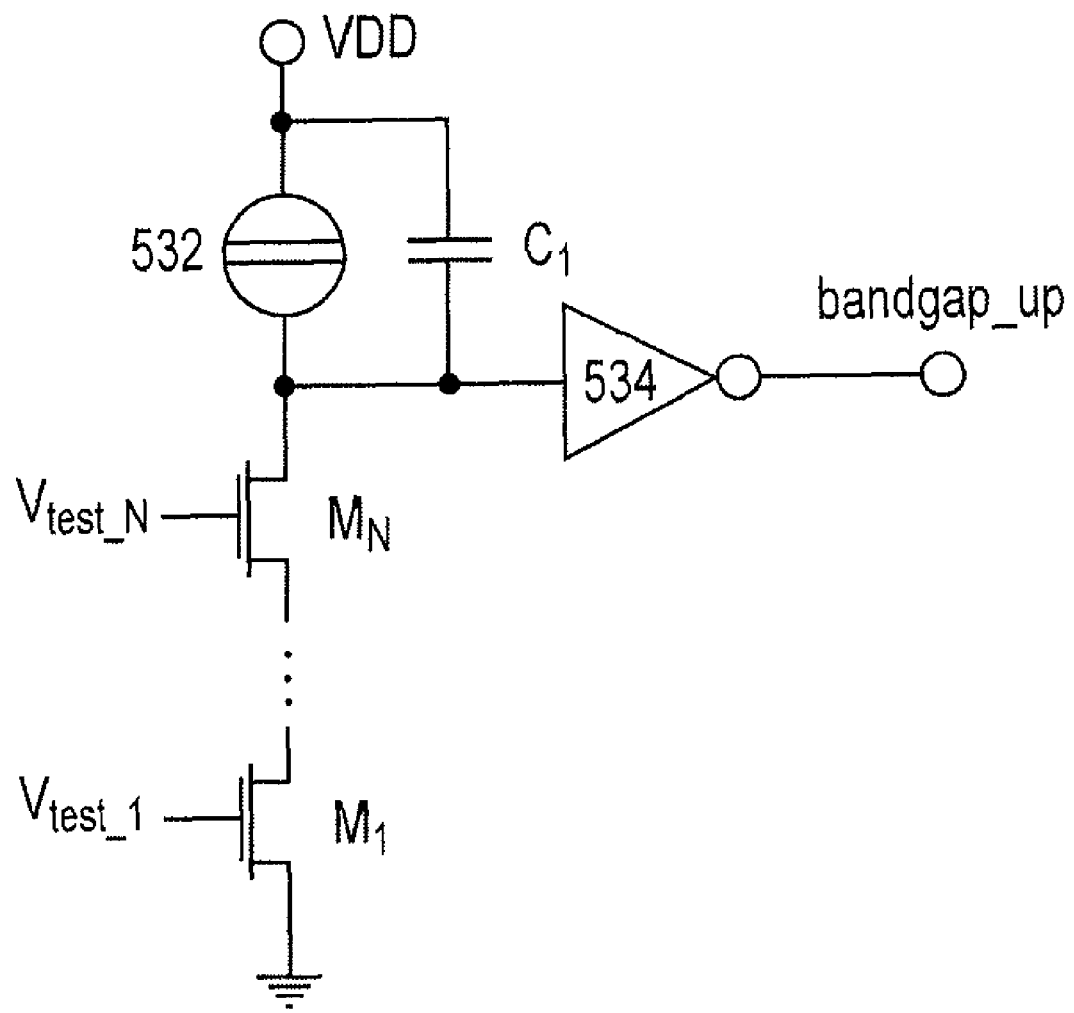
FIG. 5 illustrates one embodiment of the voltage overdrive test module.

FIG. 5 illustrates one embodiment of the voltage overdrive test module. As explained above, voltage overdrive test module is provided to detect whether a minimum operating voltage is present for test circuit 200. Specifically, voltage overdrive test module 530 is powered by supply voltage VDD and comprises current source 532 and transistors $M_1 \ldots M_n$. In operation, voltage overdrive test module 530 monitors the level of output Vtest_1 and, in some embodiments, the voltage levels at Vtest_2, . . . , Vtest_N. In the exemplary embodiment, output Vtest_1 may in fact be bandgap voltage reference Vbgp.

Voltage overdrive test module 530 further comprises inverter 534. At startup, the voltage provided to the input of inverter 534 will be low, and, therefore, its output vtoverdrive_test_n will assume a high state providing a fail signal. It should be clear that this output vtoverdrive_test_n corresponds to the output vtoverdrive_test_n of voltage overdrive test module 230 illustrated in FIG. 2. Moreover, because voltage overdrive test module 530 is operating initially when there is little or no voltage being received by the antenna of the electronic device, there is also no available voltage reference. Voltage overdrive test module 530 will therefore exploit the thresholds of $M_1 \ldots M_N$ and the output voltage will cause the output of inverter 534 to assume a low state (a pass signal) once the input signals reach a certain overdrive. In one embodiment, capacitor C1 is provided to force the output voltage low in instances where supply voltage VDD increases quickly. Voltage overdrive test module 530 also includes input (shown in FIG. 2) to receive the bandgap_up operating signal as an enable signal en_n. Accordingly, as discussed above, once the bandgap_up operating signal assumes a high state, voltage overdrive test module 530 will become disabled in response thereof, with output vtoverdrive_test_n remaining in a low state.

FIG. 6 illustrates a flowchart for a method for monitoring a bandgap circuit 600. Initially, in Step 610, test voltage overdrive test module 230 determines if a minimum operating voltage is available for test circuit 200. Once the minimum operating voltage is present, reference voltage test module 210 then compares supply voltage VDD with a threshold minimum voltage at Step 620. At Step 630, voltage output test module 220 compares the output voltage Vref_buf of bandgap circuit 100 with a minimum threshold voltage and provides a delay until capacitor $C_{enable\_delay}$ is fully charged. The method is not limited to Step 630 occurring after Steps 620. Rather, Step 630 may occur concurrently with Step 620 or before Step 620.

At Steps 610, 620 and 630, once each of the respective test modules have determined that the operating requirements which they monitor have been satisfied, each of these test modules will output a pass signal to logic circuit 240. In response, logic circuit 240 outputs a bandgap_up operating signal to other components of the electronic device as well as voltage output test module 220 and voltage overdrive test module 230 (Step 640). Of course, if logic circuit 240 has not received a pass signal from all three test modules, then the bandgap_up operating signal will remain disabled and Step 640 will not be performed. At Step 650, after receiving the bandgap_up operating signal, the electronic device begins normal operation while voltage output test module 220 and voltage overdrive test module 230 become disabled. Subsequently, if supply voltage VDD drops below a threshold minimum voltage, reference voltage test module 210 outputs a fail signal, causing the bandgap_up operating signal to be disabled (Step 660). Once the bandgap_up operating signal is disabled, the electronic device proactively shuts down and resets all of its components at Step 670, such that they will operate correctly upon restart.

While the foregoing has been described in conjunction with an exemplary embodiment, it is understood that the term "exemplary" is merely meant as an example, rather than the best or optimal. Accordingly, the application is intended to cover alternatives, modifications and equivalents, which may be included within the spirit and scope of the invention.

Additionally, in the preceding detailed description, numerous specific details have been set forth in order to provide a thorough understanding of the present invention. However, it should be apparent to one of ordinary skill in the art that the inventive test circuit may be practiced without these specific details. In other instances, well-known methods, procedures, components, and circuits have not been described in detail so as not to unnecessarily obscure aspects of the application.

What is claimed is:

1. A test circuit for monitoring a bandgap circuit that outputs a bandgap reference voltage, comprising:
   a reference voltage test module configured to output a first pass signal when an operating voltage of the bandgap circuit is greater than a first threshold voltage;
   an output test module configured to output a second pass signal when an output voltage of the bandgap circuit is greater than a second threshold voltage;
   an overdrive test module configured to output a third pass signal when a minimum operating voltage of the test circuit is detected; and
   a logic circuit coupled to outputs of each of the modules, and configured to output an operating signal after receiving the first, second, and third pass signals,
   wherein the operating signal indicates that the bandgap reference voltage is stable.

2. The test circuit of claim 1, wherein the reference voltage test module is further configured to output a first fail signal when the operating voltage of the bandgap circuit is less than the first threshold voltage; the output test module is further configured to output a second fail signal when the output voltage of the bandgap circuit is less than the second threshold voltage; and the overdrive test module is further configured to output a third fail signal when the minimum operating voltage of the test circuit is not detected.

3. The test circuit of claim 2, wherein the logic circuit disables the operating signal upon receipt of at least one of the first, second, and third fail signals.

4. The test circuit of claim 1, wherein the operating voltage of the bandgap circuit and the first threshold voltage are measured at two different points in the bandgap circuit.

5. The test circuit of claim 1, wherein the output test module is further configured to output the second pass signal after a delay.

6. The test circuit of claim 1, wherein the second threshold voltage is less than the bandgap reference voltage.

7. The test circuit of claim 1, wherein the output module and the overdrive test module are further configured to receive the operating signal.

8. The test circuit of claim 7, wherein the output module and the overdrive test module are disabled when the operating signal is received.

9. The test circuit of claim 8, wherein the output module and the overdrive test module are enabled when the operating signal is no longer received.

10. The test circuit of claim 8, wherein the output test module and the overdrive test module are configured to continue to output the second and third pass signals, respectively, while disabled.

11. An electronic device comprising the test circuit of claim 1, and configured to use the bandgap reference voltage as a reference voltage upon detection of the operating signal.

12. The electronic device of claim 11, further configured to disable its operation when the operating signal is not present.

13. The electronic device of claim 11, wherein the electronic device is a contactless card.

14. A test circuit for monitoring a bandgap circuit that outputs a bandgap reference voltage, comprising:
    a reference voltage testing means for outputting a first pass signal when an operating voltage of the bandgap circuit is greater than a first threshold voltage;
    an output testing means for outputting a second pass signal when an output voltage of the bandgap circuit is greater than a second threshold voltage;
    an overdrive testing means for outputting a third pass signal when a minimum operating voltage of the test circuit is detected; and
    a logic means for outputting an operating signal after receiving the first, second, and third pass signals,
    wherein the operating signal indicates that the bandgap reference voltage is stable.

15. The test circuit of claim 14, wherein the reference voltage testing means outputs a first fail signal when the operating voltage of the bandgap circuit is less than the first threshold voltage; the output testing means outputs a second fail signal when the output voltage of the bandgap circuit is less than the second threshold voltage; and the overdrive testing means outputs a third fail signal when the minimum operating voltage of the test circuit is not detected.

16. The test circuit of claim 15, wherein the logic means disables the operating signal upon receipt of at least one of the first, second, and third fail signals.

17. The test circuit of claim 14, wherein the output testing means outputs the second pass signal after a delay.

18. A testing method for monitoring a bandgap circuit that outputs a bandgap reference voltage, the method comprising:
    outputting a first pass signal, by a reference voltage test module, when an operating voltage of the bandgap circuit is greater than a first threshold voltage;
    outputting a second pass signal, by an output test module, when an operating voltage of the bandgap circuit is greater than a threshold voltage;

outputting a third pass signal, by an overdrive test module, when a minimum operating voltage of the test circuit is detected; and outputting an operating signal, by a logic circuit, after receiving the first, second and third pass signals, wherein the operating signal indicates that the bandgap reference voltage is stable.

19. The method of claim 18, further comprising outputting a first fail signal, by the reference voltage test module, when the operating voltage of the bandgap circuit is less than the first threshold voltage; outputting a second fail signal, by the output test module when the output voltage of the bandgap circuit is less than the second threshold voltage; and the overdrive test module is further configured to output a third fail signal when the minimum operating voltage of the test circuit is not detected.

20. The method of claim 19, further comprising disabling the operating signal if any of the modules output a fail signal.

21. The method of claim 18, further comprising outputting a pass signal, by the output module, after a delay.

22. The method of claim 18, further comprising disabling the output test module and the overdrive test module when the operating signal is output.

23. The method of claim 18, further comprising using the bandgap reference voltage as a reference voltage, by an electronic device, after the operating signal is output.

24. The method of claim 23, further comprising disabling the electronic device from operation when the operating signal is no longer output.

* * * * *